(12) United States Patent
Chi

(10) Patent No.: US 8,164,195 B2
(45) Date of Patent: Apr. 24, 2012

(54) PAD STRUCTURE OF SEMICONDUCTOR INTEGRATED CIRCUIT APPARATUS

(75) Inventor: Sung-Soo Chi, Ichon (KR)

(73) Assignee: Hynix Semiconductor, Inc. (KR)

( * ) Notice: Subject to any disclaimer, the term of this patent is extended or adjusted under 35 U.S.C. 154(b) by 649 days.

(21) Appl. No.: 12/336,390

(22) Filed: Dec. 16, 2008

(65) Prior Publication Data

US 2010/0090353 A1    Apr. 15, 2010

(30) Foreign Application Priority Data

Oct. 10, 2008   (KR) .................. 10-2008-0099558

(51) Int. Cl.
*H01L 23/488* (2006.01)
(52) U.S. Cl. ........ 257/773; 257/774; 257/776; 257/782; 257/786; 257/E21.507; 257/E23.01; 257/E23.02; 257/E23.11; 438/612
(58) Field of Classification Search .................. 257/773, 257/774, 776, 782, 786, E21.507, E23.01, 257/E23.015, E23.02, E23.11; 438/612
See application file for complete search history.

(56) References Cited

U.S. PATENT DOCUMENTS

| 5,736,791 | A | * | 4/1998 | Fujiki et al. | ................... 257/781 |
| 6,100,573 | A | * | 8/2000 | Lu et al. | ......................... 257/508 |
| 6,465,895 | B1 | | 10/2002 | Park et al. | |
| 6,489,689 | B2 | * | 12/2002 | Nojiri | ........................... 257/786 |
| 2002/0000668 | A1 | * | 1/2002 | Sakihama et al. | ............. 257/758 |
| 2004/0089954 | A1 | * | 5/2004 | Hembree et al. | ............... 257/780 |
| 2008/0003820 | A1 | | 1/2008 | Huang et al. | |
| 2008/0111250 | A1 | * | 5/2008 | Melville et al. | ................ 257/782 |

FOREIGN PATENT DOCUMENTS

| JP | 06-204283 | 7/1994 |
| JP | 2007-214349 | 8/2007 |
| KR | 1020000016849 | 3/2000 |

* cited by examiner

*Primary Examiner* — Eugene Lee
*Assistant Examiner* — Peniel M Gumedzoe
(74) *Attorney, Agent, or Firm* — Baker & McKenzie LLP

(57) ABSTRACT

A pad structure of a semiconductor integrated circuit apparatus includes a semiconductor substrate upon which circuit patterns forming a device are disposed, a pad disposed on an uppermost part of the semiconductor substrate, and a plurality of fixing parts, each disposed along opposing edge portions of the pad to fix the pad and the semiconductor substrate to each other.

17 Claims, 6 Drawing Sheets

PAD STRUCTURE OF SEMICONDUCTOR INTEGRATED CIRCUIT APPARATUS

CROSS-REFERENCES TO RELATED PATENT APPLICATION

The present application claims priority under 35 U.S.C 119(a) to Korean Application No. 10-2008-0099558, filed on Oct. 10, 2008 in the Korean Intellectual Property Office, which is incorporated herein by reference in its entirety as if set forth in full.

BACKGROUND

1. Technical Field

The embodiments described herein relate to a semiconductor integrated circuit apparatus, and more particularly, to a pad structure of a semiconductor integrated circuit apparatus.

2. Related Art

In general, a pad is a conductive pattern for transmitting signals to an interior of a semiconductor integrated circuit apparatus, and can be disposed on uppermost parts of the semiconductor integrated circuit apparatus. For example, the pad is a medium for providing voltages supplied from an exterior to an internal circuit of the semiconductor integrated circuit apparatus. The pad is electrically coupled to a printed circuit substrate to which external power is provided by a connection member, such as a wire, during a process called wire bonding.

FIG. 1 is a perspective view of a conventional roll-up phenomenon of a pad. In FIG. 1, since a wire 20 is subjected to bonding with a predetermined physical load at the center of the pad 10, an edge of the pad 10 is deformed and caused to be rolled up by the load. This is called a roll-up phenomenon of the pad 10, wherein the edge of the pad 10 is torn (debonded) from a lower material layer 30 thereof. Accordingly, due to the tearing of the pad 10, a crack 40 is formed on the lower material layer 30. Here, the crack 40 of the lower material layer 30 causes leakage, and reduces electric properties of the semiconductor integrated circuit apparatus.

SUMMARY

A pad structure of a semiconductor integrated circuit apparatus capable of providing improved electrical properties is described herein.

In one aspect, a pad structure of a semiconductor integrated circuit apparatus includes a semiconductor substrate upon which circuit patterns forming a device are disposed, a pad disposed on an uppermost part of the semiconductor substrate, and a plurality of fixing parts, each disposed along opposing edge portions of the pad to fix the pad and the semiconductor substrate to each other.

In another aspect, a pad structure of a semiconductor integrated circuit apparatus includes a semiconductor substrate upon which circuit patterns forming a device are disposed, an insulating film formed on the circuit patterns of the semiconductor substrate, a pad formed on an upper part of the insulating film and having a substantially rectangular structure, a buffer metal pattern array disposed between the semiconductor substrate and the insulating film, the buffer metal pattern includes a plurality of buffer metal patterns overlapping the pad, and a plurality of contact plugs disposed along outer side edges of the pad to electrically interconnect and fix the pad and the plurality of buffer metal patterns.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 1:
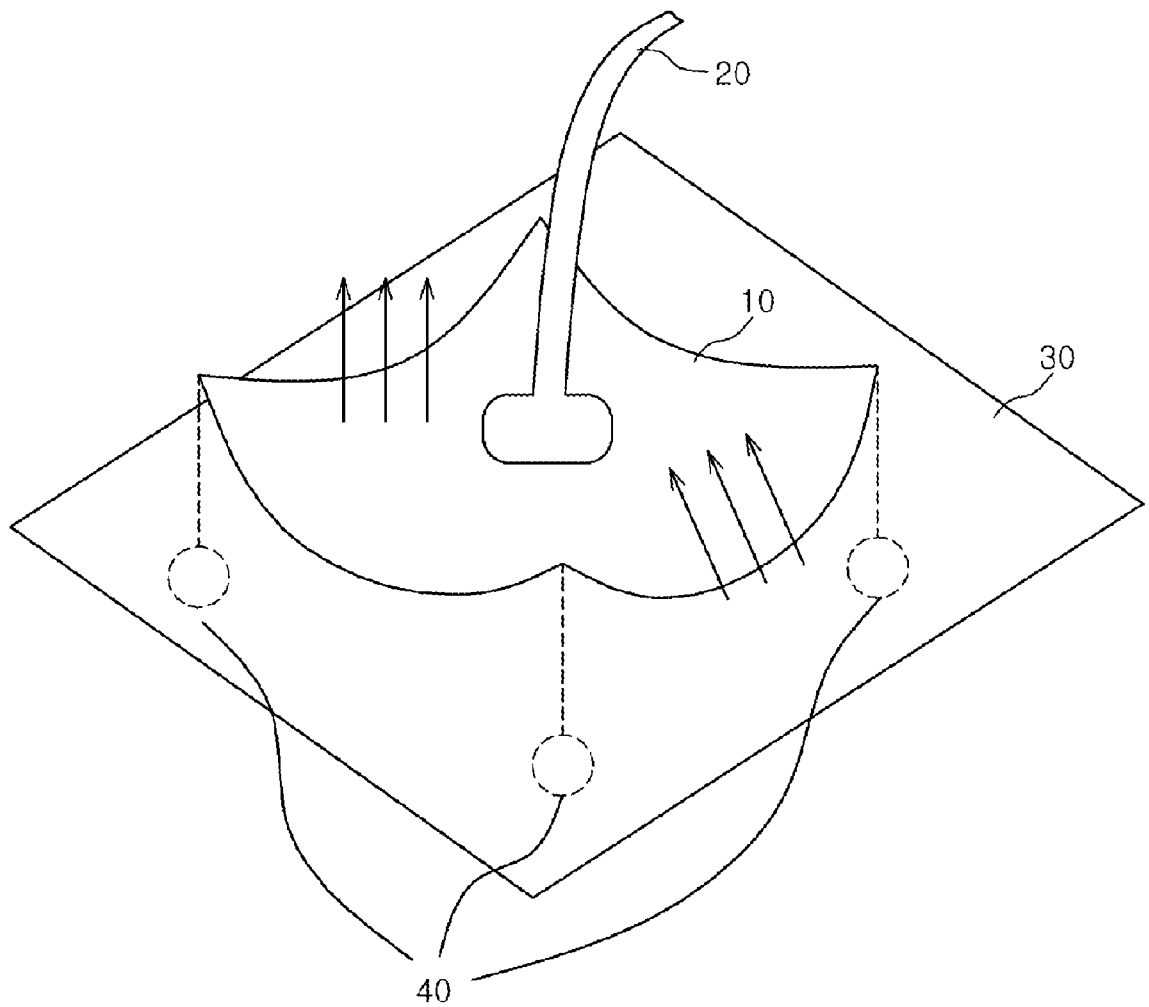
FIG. 1 is a perspective view of a conventional roll-up phenomenon of a pad.
Figure 2:
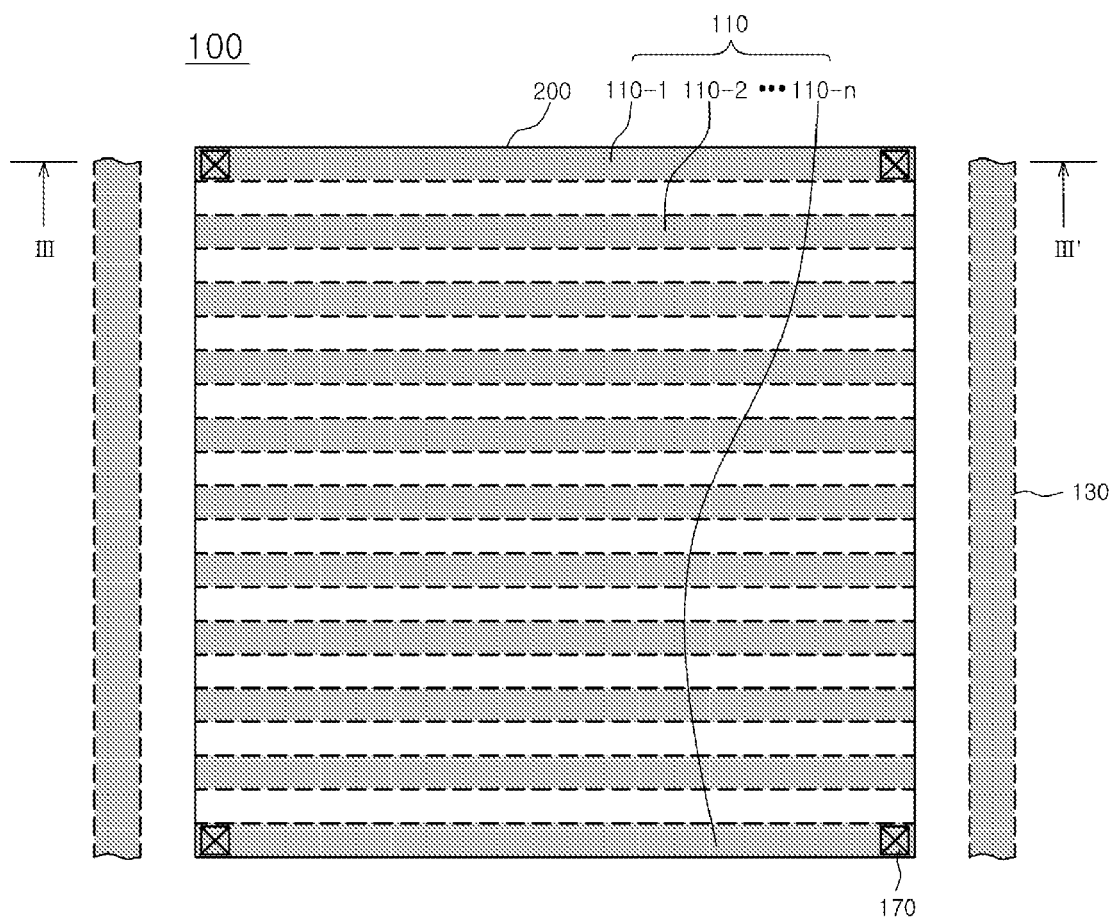
FIG. 2 is a plan view of an exemplary pad structure according to one embodiment.
Figure 3:
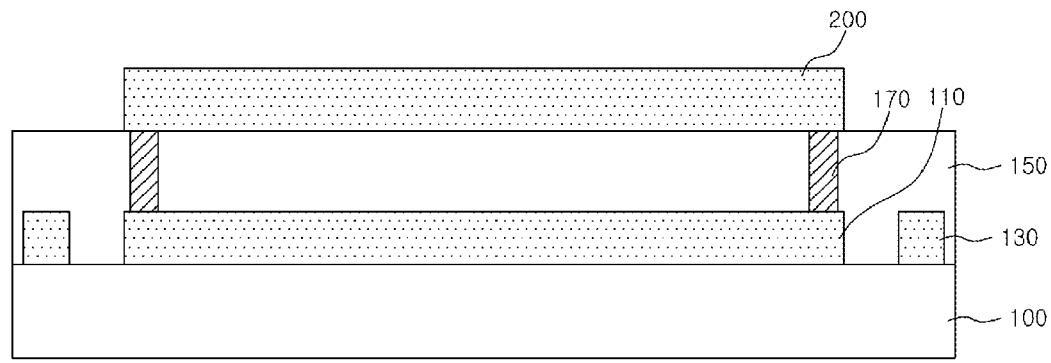
FIG. 3 is a cross-sectional view along III-III' of the structure of FIG. 2 according to one embodiment.

FIG. 2 is a plan view of an exemplary pad structure 200 according to one embodiment, and FIG. 3 is a cross-sectional view along III-III' of the structure 200 of FIG. 2 according to one embodiment. In FIGS. 2 and 3, a pad 200 can be arranged on a substantially uppermost part of a semiconductor substrate 100. Here, the semiconductor substrate 100 can include circuit patterns (not shown) that form volatile memory devices, or non-volatile memory devices, and insulating films (not shown) that insulate them. The pad 200 can receive predetermined signals from an exterior of the substrate 100 to directly or indirectly supply the predetermined signals to predetermined electrode terminals for actuating the volatile memory devices or the non-volatile memory devices. For example, a plurality of pads 200 can be arranged on the semiconductor substrate 100, wherein each of the plurality of pads 200 can have a substantially rectangular geometry. Alternatively, each of the plurality of pads 200 can have other geometries, or each of the plurality of pads 200 can have different geometries from each other.

In FIGS. 2 and 3, a buffer metal pattern array 110 can be configured to include a plurality of buffer metal patterns 110-1 to 110-n provided on the semiconductor substrate 100 along a lowermost part of the pad 200 to overlap the pad 200. The buffer metal pattern array 110 can serve to protect device patterns (not shown) formed on the semiconductor substrate 100 and electrically interconnect an electrode terminal (not shown) in the semiconductor device and the pad 200. The plurality of buffer metal patterns 110-1 to 110-n can be arranged parallel to each other at a predetermined interval while having a predetermined line width. In addition, an insulating film 150 can be provided between the pad 200 and the buffer metal pattern array 110. Although FIG. 2 shows that the predetermined interval between adjacent ones of the plurality of buffer metal patterns 110-1 to 110-n are approximately equal to a width of the plurality of buffer metal patterns 110-1 to 110-*n*, the predetermined interval may be increased of decreased to be greater or less than a width of the plurality of buffer metal patterns 110-1 to 110-*n*. Conversely, although FIG. 2 shows widths of the plurality of buffer metal patterns 110-1 to 110-*n* are approximately equal to the predetermined interval between adjacent ones of the plurality of buffer metal patterns 110-1 to 110-*n*, the widths of the plurality of buffer metal patterns 110-1 to 110-*n* can be increased or decreased to be greater or less than the predetermined interval.

In FIG. 3, at least one pair of fixing parts 170 can be provided at an edge of the pad 200. For example, each of the fixing parts 170 can be provided as a contact plug that electrically interconnects the pad 200 and the semiconductor substrate 100, and preferably interconnects the plurality of buffer metal patterns 110-1 to 110-*n* to each other. Here, it is important that at least one pair of the fixing parts 170 are formed to face each other along a lengthwise direction of one of the buffer metal patterns 110-1 to 110-*n*.

When the pad 200 has the rectangular structure, the fixing parts 170 can be configured to be disposed at four corners thereof. Accordingly, the fixing part 170 can be contacted with the buffer metal pattern 110 and the pad 200 to generate electrostatic attractive forces between contact surfaces of the fixing part 170, the buffer metal pattern 110, and the pad 200. Thus, while the wire bonding process is performed, even though pressure can be supplied from an exterior of the pad 200, the pad 200 can maintain its initial shape.

In FIG. 3, a power line 130 can be arranged relatively close to the pad 200, and may be disposed on substantially the same plane as the buffer metal pattern 110. In addition, the power line 130 may extend substantially perpendicular to the buffer metal pattern 110.

An exemplary manufacturing method of the pad structure will be explained with reference to FIG. 3. In FIG. 3, a lower metal wire layer (not shown) can be formed on the semiconductor substrate 100 upon which predetermined device patterns can be formed. Then, the lower metal wire layer (not shown) can be at least partially patterned to form the buffer metal pattern array 110 configured to include the buffer metal patterns 110-1 to 110-*n* and the power line 130. Alternatively, the buffer metal patterns 110-1 to 110-*n* and the power line 130 can be made during different individual processes, and can be formed of different material(s).

Next, depositing the insulating film 150 can be deposited on an upper part of the semiconductor substrate 100 upon which the buffer metal pattern array 110 and the power line 130 are formed. Then, the insulating film 150 can be etched to expose ends of the buffer metal patterns 110-1 to 110-*n* corresponding to an edge of the buffer metal pattern array 110 to form a contact hole. Then, the fixing part 170 having the contact plug shape can be formed by filling conductive material in the contact hole. In addition, the deposition of the insulating film 150 can also be simultaneously performed over other components on the substrate 100. Moreover, the etching and filling processes can be used to perform etching and filling of other components on the substrate, as well.

Next, the upper metal wire layer (not shown) can be formed on the upper part of the insulating film 150 to contact the fixing part 170. Then, the upper metal wire layer (not shown) can be at least partially etched to form the pad 200. In addition, the upper metal wire layer (not shown) can be formed over other components on the substrate 100, and subsequently etched to form various conduction pathways and vias.

Figure 4:
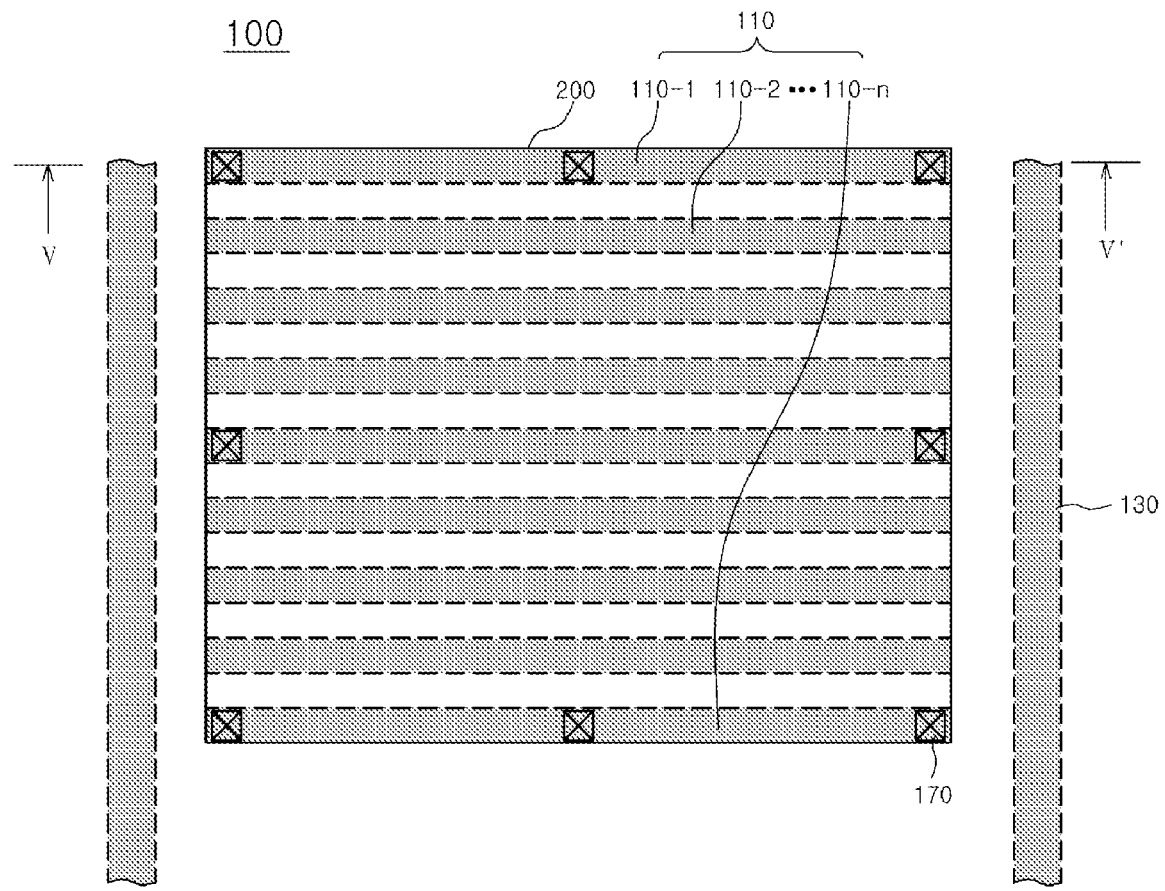
FIG. 4 is a plan view of another exemplary pad structure according to another embodiment.
Figure 5:
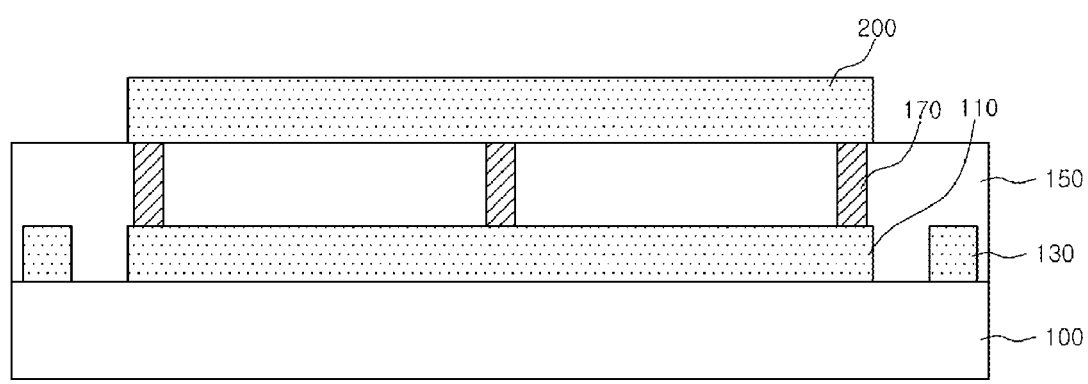
FIG. 5 is a cross-sectional view along V-V' of the structure of FIG. 4 according to one embodiment.

FIG. 4 is a plan view of another exemplary pad structure 200 according to another embodiment, and FIG. 5 is a cross-sectional view along V-V' of the structure 200 of FIG. 4 according to one embodiment. In FIGS. 4 and 5, the plurality of fixing parts 170 can be provided as a matrix array at four corners of the rectangular pad 200, and can be provided at substantially center regions of outermost ones of the buffer metal patterns 110-1 to 110-*n*. Moreover, the fixing parts 170 can be provided at end portions of a middle one, or at end portions of middle ones, of the buffer metal patterns 110-1 to 110-*n*. Accordingly, the pad 200 can be more stably be fixed.

Figure 6:
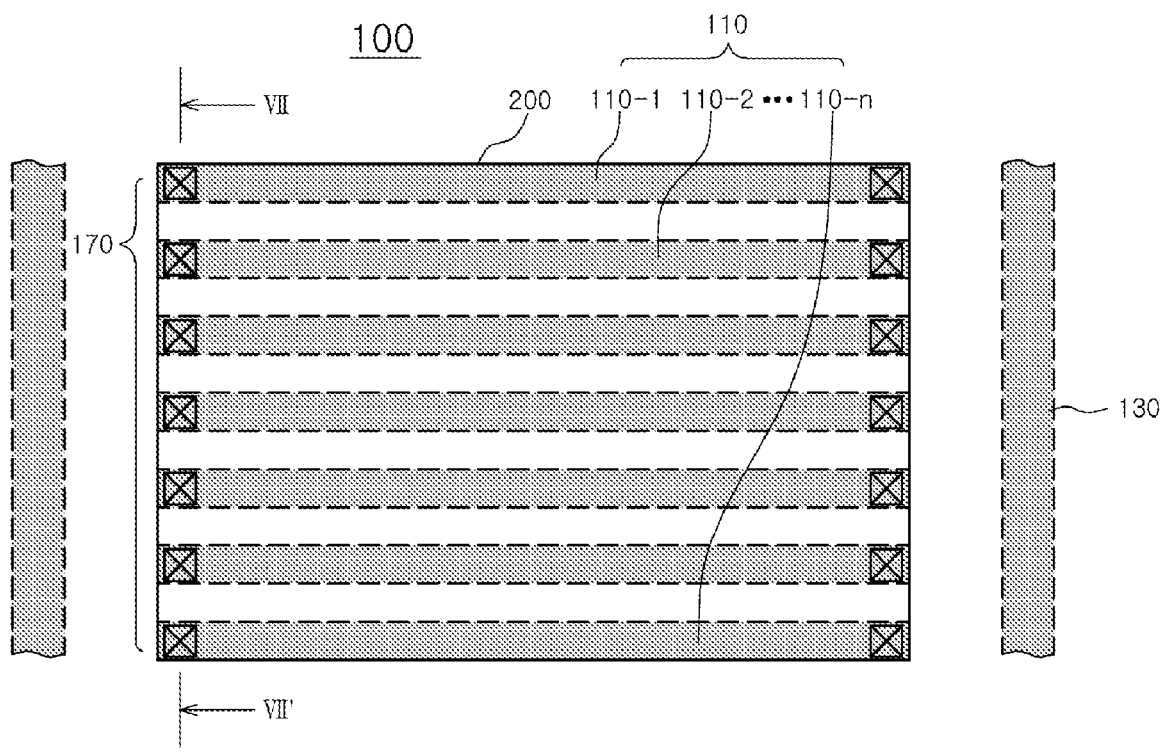
FIG. 6 is a plan view of another exemplary pad structure according to another embodiment.
Figure 7:
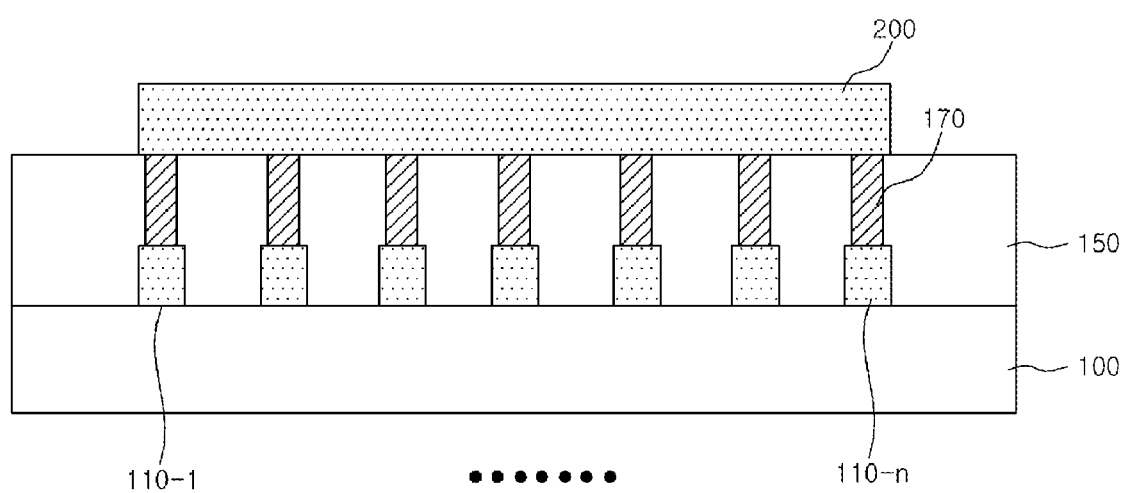
FIG. 7 is a cross-sectional view along VII-VII' of the structure of FIG. 6 according to one embodiment.

FIG. 6 is a plan view of another exemplary pad structure 200 according to another embodiment, and FIG. 7 is a cross-sectional view along VII-VII' of the structure 200 of FIG. 6 according to one embodiment. In FIGS. 6 and 7, the plurality of fixing parts 170 can be formed as a linear array along each of the sides that are parallel to the power line 130. For example, the fixing parts 170 can be provided at both ends of each of the buffer metal patterns 110-1 to 110-*n*. Accordingly, the pad 200 can be further stably be fixed.

Figure 8:
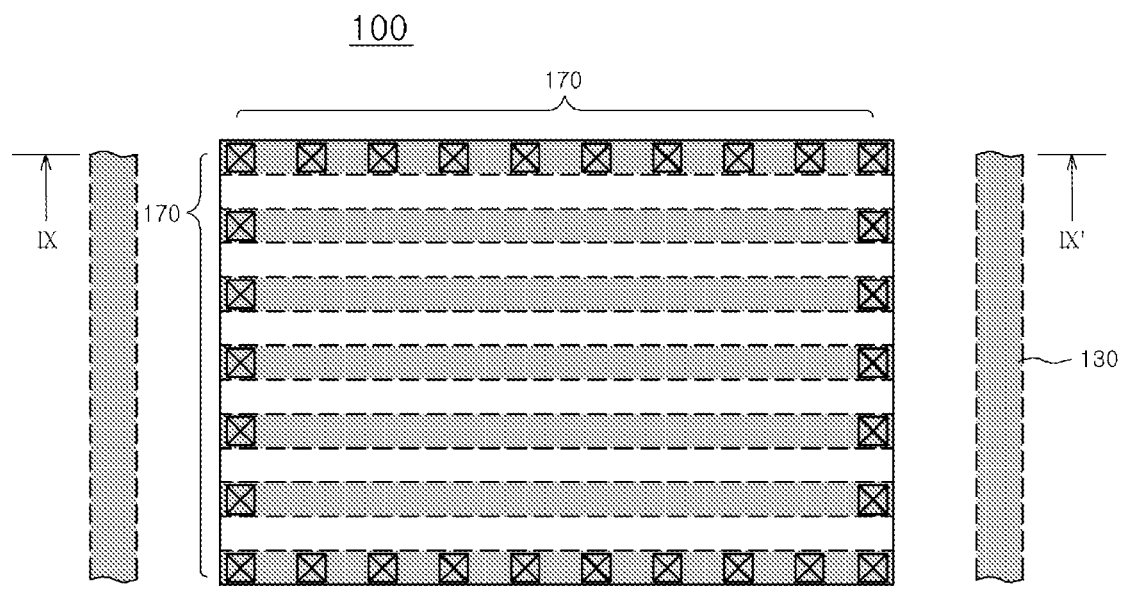
FIG. 8 is a plan view of another exemplary pad structure according to another embodiment.
Figure 9:
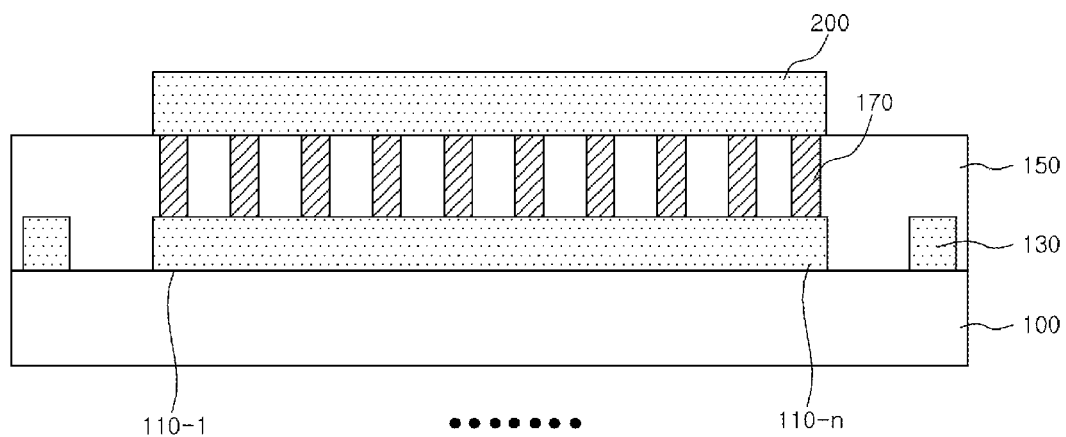
FIG. 9 is a cross-sectional view along IX-IX' of the structure of FIG. 8 according to one embodiment.

FIG. 8 is a plan view of another exemplary pad structure 200 according to another embodiment, and FIG. 9 is a cross-sectional view along IX-IX' of the structure 200 of FIG. 8 according to one embodiment. In FIGS. 8 and 9, the plurality of fixing parts 170 can be provided as a perimeter array along each side of the pad 200. Along the side of the pad 200 that is parallel to the power line 130, a first group of the fixing parts 170 can be formed at both ends of the buffer metal patterns 110-1 to 110-*n*. In addition, along the side of the pad that is perpendicular to the power line 130, a second group of the fixing parts 170 can be formed outmost ones of the buffer metal patterns 110-1 and 110-*n* at a predetermined interval. Here, the predetermined interval is shown to be substantially equal along a lengthwise direction of the outermost ones of the buffer metal patterns 110-1 and 110-*n*.

In addition, the second group of the fixing parts 170 on the outermost ones of the buffer metal patterns 110-1 and 110-*n* can be in a one-to-one correspondence. For example, the number and placement of the second group of the fixing parts 170 on each of the outermost ones of the buffer metal patterns 110-1 and 110-*n* can be substantially the same. Here, there is no offset of each of the second group of the fixing parts 170. However, although not shown, the second group of the fixing parts 170 can be offset from each other. Accordingly, the pad 200 can be more stably be fixed, and the roll-up phenomenon of the pad 200 can be completely prevented.

Figure 10:
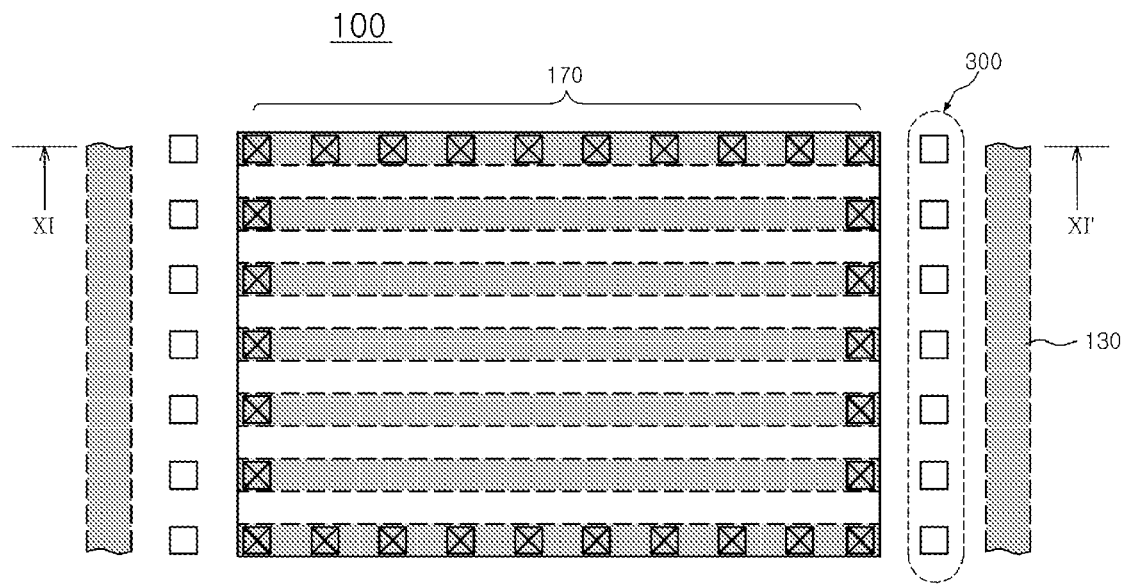
FIG. 10 is a plan view of another exemplary pad structure according to another embodiment.
Figure 11:
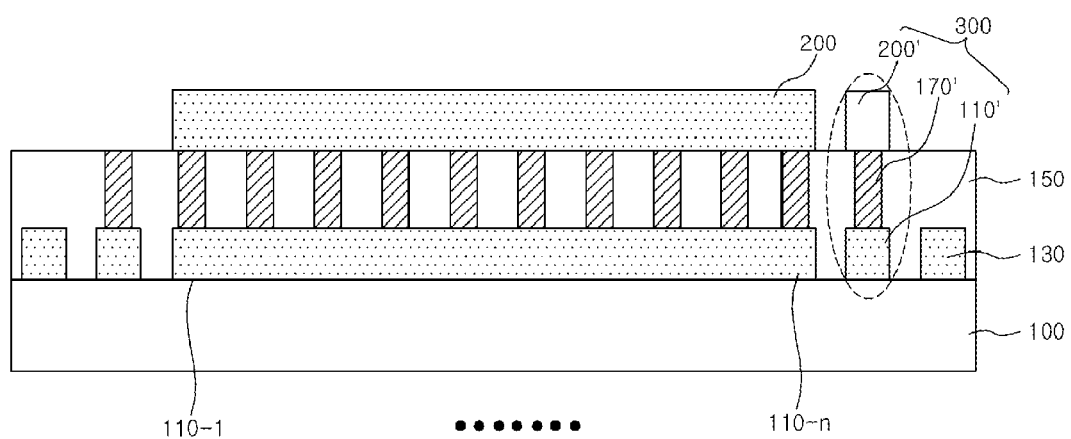
FIG. 11 is a cross-sectional view along XI-XI' of the structure of FIG. 10 according to one embodiment.

FIG. 10 is a plan view of another exemplary pad structure 200 according to another embodiment, and FIG. 11 is a cross-sectional view along XI-XI' of the structure 200 of FIG. 10 according to one embodiment. In FIGS. 10 and 11, a blocking wire 300 can be further disposed between the pad 200 and the power line 130. The blocking wire 300 can be configured to include a dummy pattern 110', a dummy plug 170', and a dummy pad pattern 200'. For example, the dummy pattern 110' can be formed on substantially the same plane as the buffer metal pattern array 110, the dummy plug 170' can be formed on substantially the same plane as the fixing part 170, and the dummy pad pattern 200' can be formed on substantially the same plane as the pad 200. Here, the blocking wire 300 can function to prevent signal crosstalk between the pad 200 and the power line 130, which the pad 200 is in a floating state, i.e., no specific biasing or signal transmission.

Since the blocking wire 300 can be formed by using substantially the same processes as those used to from the buffer metal pattern array 110, the fixing part 170, and the pad 200, a separate process is not required. Accordingly, formation of the blocking wire 300 can be formed simultaneously with formation of the buffer metal pattern array 110, the fixing part 170, the pad 200, and the power line 130, as well as other components on the substrate 100.

Although the blocking wire 300 is shown exclusively with the pad structure of FIGS. 9 and 10, the blocking wire 300 can be formed with any of the pad structures of FIGS. 2-8. Moreover, although the blocking wire 300 is shown to be substantially equidistant from the power line 300 and the end portions of the buffer metal pattern array 110, the blocking wire 300 can be disposed more toward either the power line 300 and the end portions of the buffer metal pattern array 110. Furthermore, although the blocking wire 300 is shown to include a plurality of the fixing parts 170 formed in a linear array, the block wire 300 and the plurality of the fixing parts 170 can be offset from one another in a staggered configuration. Alternatively, other geometries may be used with which to form the blocking wire 300.

In each of FIGS. 2-11, the power line 130 is shown to extend perpendicular to the lengthwise direction of the buffer metal patterns 110-1 to 110-$n$ along either side of the buffer metal pattern array 110. However, the power line 130 may be provided to extend parallel with the lengthwise direction of the buffer metal patterns 110-1 to 110-$n$ along either side of the buffer metal pattern array 110. Moreover, power lines 130 may be provided both perpendicular to and in parallel with the lengthwise direction of the buffer metal patterns 110-1 to 110-$n$, at different planes to the buffer metal pattern array 110. Similarly, the blocking wire 300 (in FIGS. 10 and 11) may also be provided having different directions, as the power lines 130.

Accordingly, as shown in FIGS. 2-11, the fixing parts 170 can have a contact plug shape and can be provided on at least two portions of the edge of the pad 200, which face each other. Accordingly, while subsequent wiring bonding processes are performed, even though a load can be applied to the pad 20, the rolling phenomenon can be prevented, since the edges of the pad 200 can be fixed by the fixing parts 170. Thus, a crack phenomenon of the underlying insulating film due to the tearing of the pad 200 can be prevented, thereby improving the prevention of leakage current.

While certain embodiments have been described above, it will be understood that the embodiments described are by way of example only. Accordingly, the device and methods described herein should not be limited based on the described embodiments. Rather, the device and methods described herein should only be limited in light of the claims that follow when taken in conjunction with the above description and accompanying drawings.

What is claimed is:

1. A pad structure of a semiconductor integrated circuit apparatus, comprising:
   a semiconductor substrate upon which circuit patterns forming a device are disposed;
   a pad disposed on an uppermost part of the semiconductor substrate;
   a plurality of fixing parts, each disposed along opposing edge portions of the pad to fix the pad and the semiconductor substrate to each other;
   a signal line disposed on at least one side of the pad; and
   a blocking wire disposed between the signal line and the pad to prevent signal crosstalk.

2. The pad structure of claim 1, wherein the plurality of fixing parts is disposed between the semiconductor substrate and the pad.

3. The pad structure of claim 2, wherein each of the plurality of fixing parts includes a contact plug that electrically interconnects the semiconductor substrate and the pad to each other.

4. The pad structure of claim 2, further comprising an insulating film disposed between the semiconductor substrate and the pad.

5. The pad structure of claim 4, wherein the contact plug is formed within the insulating film.

6. The pad structure of claim 5, further comprising a buffer metal pattern array that includes a plurality of buffer metal patterns, each disposed between the semiconductor substrate and the insulating film.

7. The pad structure of claim 6, wherein each of the plurality of fixing parts is configured to electrically interconnect the buffer metal pattern with the pad.

8. The pad structure claim 1, wherein the blocking wire includes:
   a dummy pattern disposed on substantially the same plane as the buffer metal pattern;
   a dummy pad pattern disposed on substantially the same plane as the pad; and
   a dummy plug that electrically interconnects the dummy pattern and the dummy pad pattern with each other.

9. The pad structure of claim 1, wherein the pad has a substantially rectangular structure.

10. The pad structure of claim 9, wherein each of the plurality of fixing parts is disposed at four corners of the pad.

11. The pad structure of claim 9, wherein each of the plurality of fixing parts is disposed along two opposing sides of the pad.

12. The pad structure of claim 1, wherein each of the plurality of fixing parts is disposed along four sides of the pad.

13. A pad structure of a semiconductor integrated circuit apparatus, comprising:
   a semiconductor substrate upon which circuit patterns forming a device are disposed;
   an insulating film formed on the circuit patterns of the semiconductor substrate;
   a pad formed on an upper part of the insulating film and having a substantially rectangular structure;
   a buffer metal pattern array disposed between the semiconductor substrate and the insulating film, the buffer metal pattern includes a plurality of buffer metal patterns overlapping the pad;
   a plurality of contact plugs disposed along outer side edges of the pad to electrically interconnect and fix the pad and the plurality of buffer metal patterns;
   a signal line disposed on at least one side of the pad; and
   a blocking wire disposed between the signal line and the pad to prevent signal crosstalk.

14. The pad structure of claim 13, wherein each of the plurality of contact plugs is disposed at four corners of the pad.

15. The pad structure of claim 13, wherein each of the plurality of contact plugs is disposed along opposing sides of the pad.

16. The pad structure of claim 13, wherein each of the plurality of contact plugs is disposed along four sides of the pad.

17. The pad structure of claim 13, wherein the blocking wire includes:
   a dummy pattern disposed on substantially the same plane as the buffer metal pattern;
   a dummy pad pattern disposed on substantially the same plane as the pad; and
   a dummy plug electrically interconnecting the dummy pattern and the dummy pad pattern with each other.

* * * * *